United States Patent
Shi et al.

(10) Patent No.: US 7,100,145 B2
(45) Date of Patent: *Aug. 29, 2006

(54) METHOD OF IDENTIFYING AN EXTREME INTERACTION PITCH REGION, METHODS OF DESIGNING MASK PATTERNS AND MANUFACTURING MASKS, DEVICE MANUFACTURING METHODS AND COMPUTER PROGRAMS

(75) Inventors: Xuelong Shi, Santa Clara, CA (US); Jang Fung Chen, Cupertino, CA (US); Duan-Fu Stephen Hsu, Fremont, CA (US)

(73) Assignee: ASML Masktools B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/938,510

(22) Filed: Sep. 13, 2004

(65) Prior Publication Data

US 2005/0034096 A1 Feb. 10, 2005

Related U.S. Application Data

(63) Continuation of application No. 10/083,683, filed on Feb. 27, 2002, now Pat. No. 6,792,591, which is a continuation-in-part of application No. 09/840,305, filed on Apr. 24, 2001, now Pat. No. 6,519,760.

(51) Int. Cl.
*G06F 17/50* (2006.01)
(52) U.S. Cl. .......................... 716/19; 716/21
(58) Field of Classification Search ............ 716/19–21; 430/5
See application file for complete search history.

(56) References Cited

U.S. PATENT DOCUMENTS 5,229,872 A 7/1993 Mumola
(Continued)

FOREIGN PATENT DOCUMENTS

JP 6005487 1/1994
(Continued)

OTHER PUBLICATIONS

Kim H-J Et Al: "Fabrication of Dense Contact Partterns Using Halftone Phase-Shifting Mask With Off-Axis Illumination" Proceedings of the SPIE. SPIE, Bellingham, VA., US, vol. 2793, Jun. 18, 1996, pp. 106-114, XPOO9015384 ISSN: 0277-786X.

(Continued)

*Primary Examiner*—Paul Dinh
(74) *Attorney, Agent, or Firm*—McDermott Will & Emery LLP

(57) ABSTRACT

Optical proximity effects (OPEs) are a well-known phenomenon in photolithography. OPEs result from the structural interaction between the main feature and neighboring features. It has been determined by the present inventors that such structural interactions not only affect the critical dimension of the main feature at the image plane, but also the process latitude of the main feature. Moreover, it has been determined that the variation of the critical dimension as well as the process latitude of the main feature is a direct consequence of light field interference between the main feature and the neighboring features. Depending on the phase of the field produced by the neighboring features, the main feature critical dimension and process latitude can be improved by constructive light field interference, or degraded by destructive light field interference. The phase of the field produced by the neighboring features is dependent on the pitch as well as the illumination angle. For a given illumination, the forbidden pitch region is the location where the field produced by the neighboring features interferes with the field of the main feature destructively. The present invention provides a method for determining and eliminating the forbidden pitch region for any feature size and illumination condition. Moreover, it provides a method for performing illumination design in order to suppress the forbidden pitch phenomena, and for optimal placement of scattering bar assist features.

9 Claims, 14 Drawing Sheets

U.S. PATENT DOCUMENTS

| | | | |
|---|---|---|---|
| 5,242,770 | A | 9/1993 | Chen et al. |
| 5,296,891 | A | 3/1994 | Vogt et al. |
| 5,523,193 | A | 6/1996 | Nelson |
| 5,969,441 | A | 10/1999 | Loopstra et al. |
| 6,046,792 | A | 4/2000 | Van Der Werf et al. |
| 6,077,310 | A * | 6/2000 | Yamamoto et al. ............ 716/19 |
| 6,094,305 | A | 7/2000 | Shiraishi |
| 6,519,760 | B1 | 2/2003 | Shi et al. |
| 6,544,694 | B1 * | 4/2003 | Dirksen et al. ................. 430/5 |
| 6,792,591 | B1 * | 9/2004 | Shi et al. ...................... 716/19 |
| 2002/0152452 | A1 | 10/2002 | Socha |

FOREIGN PATENT DOCUMENTS

| | | |
|---|---|---|
| JP | 6120114 | 4/1994 |
| JP | 6163350 | 6/1994 |
| JP | 6181168 | 8/1994 |
| JP | 6301192 | 10/1994 |
| JP | 7134390 | 5/1995 |
| WO | WO 98/40791 | 9/1998 |

OTHER PUBLICATIONS

"Electromagnetic diffraction in optical systems I. An integral representation of the image field", E. Wolf, (1959).

"Forbidden Pitches for 130nm lithography and below", Robert Socha et al., Optical Microlithgraphy XIII, Proceedings of SPIE, vol. 4000 (2000).

"Theory of high-NA imaging in homogeneous thin films", Donis G. Flagello et al., vol. 13, No. 1/ (Jan. 1996), J. Opt. Soc. Am. A.

"Extension of the Hopkins theory of partially coherent imaging to include thin-film interference effects", Michael S. Yeung et al., SPIE vol. 1927, Optical/Laser Microlithography VI (1993).

"An OPC Technology Roadmap to 0.14µm Design Rules", J. Fung Chen et al., SPIE vol. 3236.

"Fabrication of Dense Contact Patterns Using Halftone Phase-Shifting Mask With Off-Axis Illumination", Hyoung-Joon Kim et al., SPIE vol. 2793.

* cited by examiner

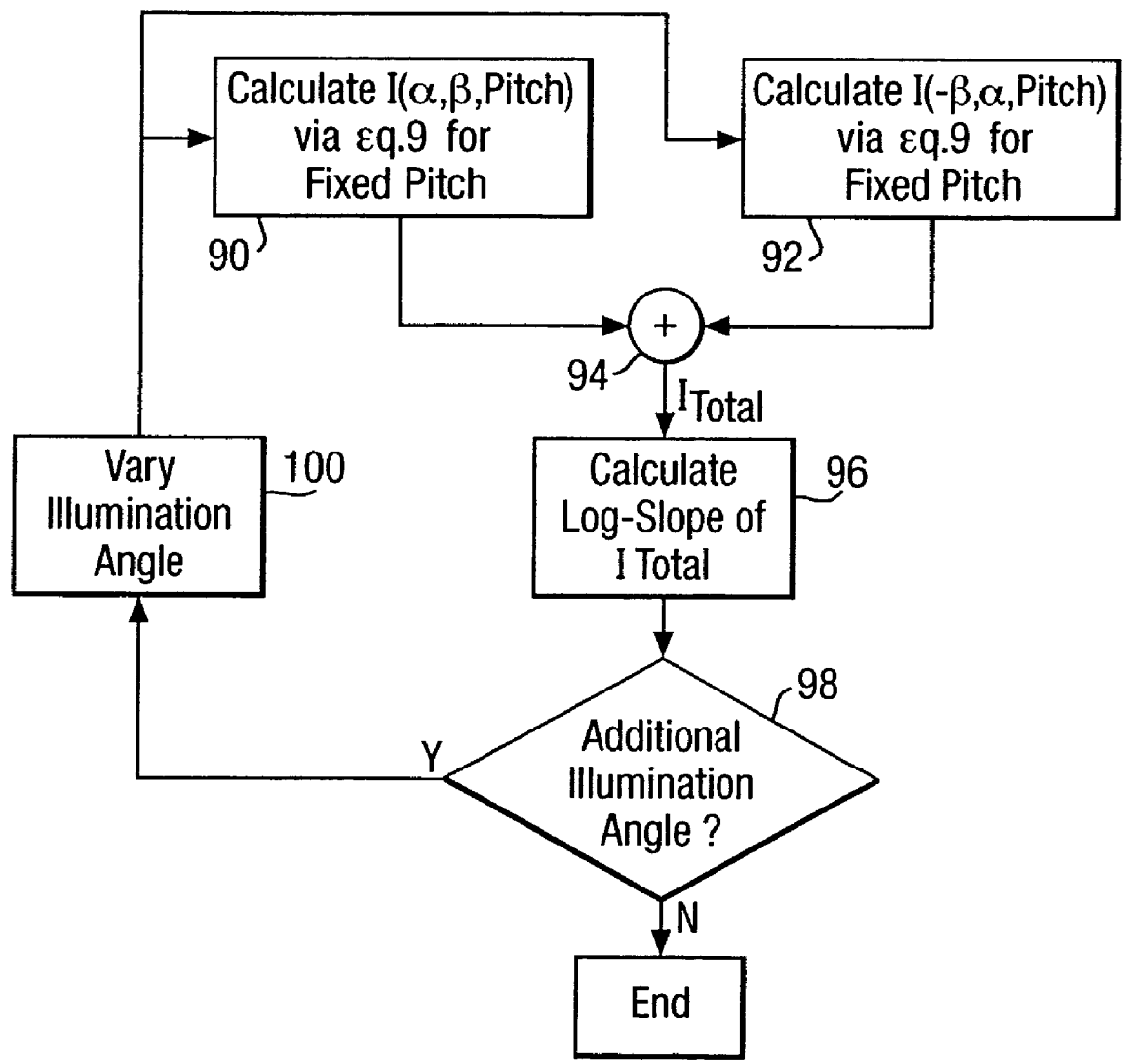

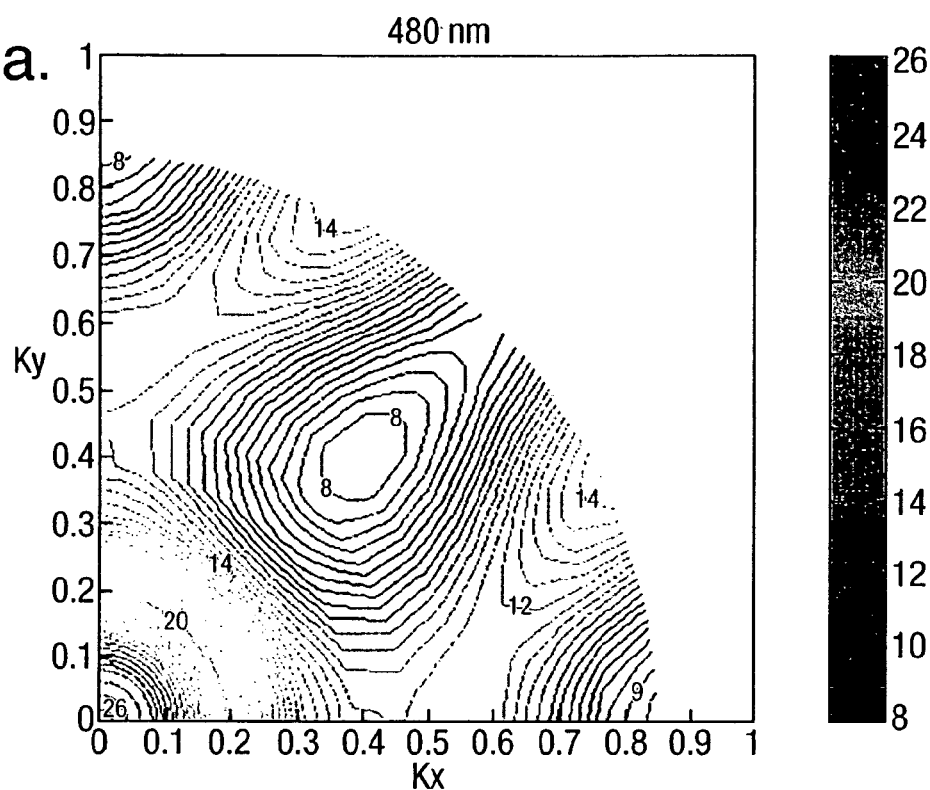
Fig. 10a. 480 nm
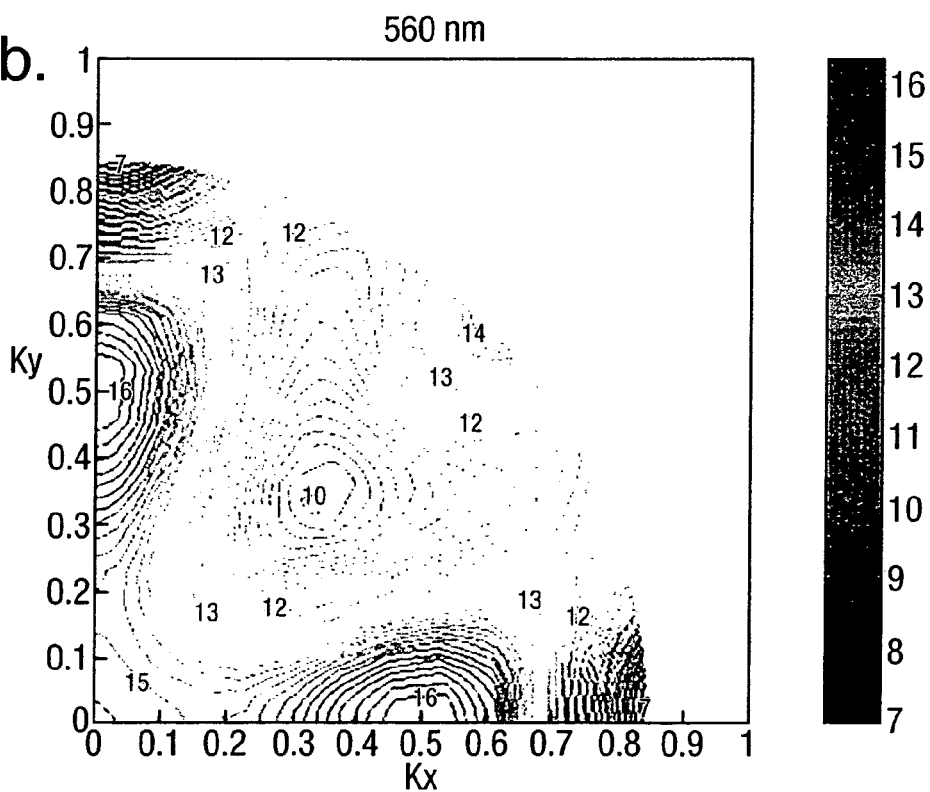
Fig. 10b. 560 nm

METHOD OF IDENTIFYING AN EXTREME INTERACTION PITCH REGION, METHODS OF DESIGNING MASK PATTERNS AND MANUFACTURING MASKS, DEVICE MANUFACTURING METHODS AND COMPUTER PROGRAMS

This application is a continuation application of application Ser. No. 10/083,683 filed Feb. 27, 2002 (now U.S. Pat. No. 6,792,591), which is a continuation in part of application Ser. No. 09/840,305 filed on Apr. 24, 2001 (now U.S. Pat. No. 6,519,760).

FIELD OF THE INVENTION

The present invention relates to photolithography and more particularly to optical proximity correction methods used during the development of photolithography masks for use in lithographic apparatus comprising:
a radiation system for supplying a projection beam of radiation;
a support structure for supporting patterning means, the patterning means serving to pattern the projection beam according to a desired pattern;
a substrate table for holding a substrate; and
a projection system for projecting the patterned beam onto a target portion of the substrate.

BACKGROUND OF THE INVENTION

The term "patterning means" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

As semiconductor manufacturing technology is quickly pushing towards the limits of optical lithography, the state-of-the-art processes to date have regularly produced ICs with features exhibiting critical dimensions ("CDs") which are below the exposure wavelength ("$\lambda$"). A "critical dimension" of a circuit is defined as the smallest width of a feature or the smallest space between two features. For feature patterns that are designed to be smaller than $\lambda$, it has been recognized that the optical proximity effect (OPE) becomes much more severe, and in fact becomes intolerable for leading edge sub-$\lambda$ production processes.

Optical proximity effects are a well known characteristic of optical projection exposure tools. More specifically, proximity effects occur when very closely spaced circuit patterns are lithographically transferred to a resist layer on a wafer. The light waves of the closely spaced circuit features interact, thereby distorting the final transferred pattern features. In other words, diffraction causes adjacent features to interact with each other in such a way as to produce pattern dependent variations. The magnitude of the OPE on a given feature depends on the feature's placement on the mask with respect to other features.

One of the primary problems caused by such proximity effects is an undesirable variation in feature CDs. For any leading edge semiconductor process, achieving tight control over the CDs of the features (i.e., circuit elements and interconnects) is typically the primary manufacturing goal, since this has a direct impact on wafer sort yield and speed-binning of the final product.

It has been known that the variations in the CDs of circuit features caused by OPE can be reduced by several methods. One such technique involves adjusting the illumination characteristics of the exposure tool. More specifically, by carefully selecting the ratio of the numerical aperture of the illumination condenser ("NAc") to the numerical aperture of the imaging objective lens ("NAo") (this ratio has been referred to as the partial coherence ratio—$\sigma$), the degree of OPE can be manipulated to some extent.

In addition to using relatively incoherent illumination, such as described above, OPE can also be compensated for by "pre-correcting" the mask features. This family of techniques is generally known as optical proximity correction (OPC) techniques.

For example, in U.S. Pat. No. 5,242,770 (the '770 patent), which is hereby incorporated by reference, the method of using scattering bars (SBs) for OPC is described. The '770 patent demonstrates that the SB method is very effective for modifying isolated features so that the features behave as if the features are dense features. In so doing, the depth of focus (DOF) for the isolated features is also improved, thereby significantly increasing process latitude. Scattering bars (also known as intensity leveling bars or assist bars) are correction features (typically non-resolvable by the exposure tool) that are placed next to isolated feature edges on a mask in order to adjust the edge intensity gradients of the isolated edges. Preferably, the adjusted edge intensity gradients of the isolated edges match the edge intensity gradients of the dense feature edges, thereby causing the SB-assisted isolated features to have nearly the same width as densely nested features.

It is generally understood that the process latitude associated with dense structures is better than that associated with isolated structures under conventional illumination for large feature sizes. However, recently, more aggressive illumination schemes such as annular illumination and multipole illumination have been implemented as a means of improving resolution and known OPC techniques have not always had the desired effects with such illumination schemes.

SUMMARY OF THE INVENTION

An object of the invention is to provide a method for optimizing mask patterns for use with various different illumination schemes.

Accordingly, the present invention provides a method and technique for identifying and eliminating forbidden pitch regions, which degrade the overall printing performance, so as to allow for an improvement of the CDs and process latitude obtainable utilizing currently known photolithography tools and techniques. The "forbidden pitch" regions are regions in which both the critical dimension of the feature and the process latitude of the feature are negatively affected.

When utilizing such illumination schemes, the inventors of the present invention have noted that some optical phenomenon have become more prominent. In particular, the inventors have noticed a forbidden pitch phenomena. More specifically, there are pitch ranges within which the process latitude of a "densely located" main feature, especially the exposure latitude, is worse than that of an isolated feature of the same size. This important observation indicates that the existence of the neighboring feature is not always beneficial for main feature printing, which is in contradiction to what is commonly conceived, prior to the discovery by the present inventors. Indeed, the present inventors believe that the forbidden pitch phenomenon has become a limiting factor in advanced photolithography. As such, suppressing the forbidden pitch phenomenon will be necessary to further improve the CDs and process latitude obtainable utilizing currently known semiconductor device manufacturing tools and techniques.

More specifically, the present invention relates to a method of identifying undesirable pitches between features when designing an integrated circuit (or other device) to be formed on a substrate by use of a lithographic exposure tool. In an exemplary embodiment, the method comprises the steps of (a) identifying extreme interaction pitch regions by determining illumination intensity levels for a given illumination angle over a range of pitches; and (b) identifying the undesirable pitches for each extreme interaction pitch region identified in step (a) by determining illumination intensities for a given extreme interaction pitch region over a range of illumination angles.

In accordance with the present invention, it is shown that the variation of the critical dimension as well as the process latitude of a main feature is a direct consequence of light field interference between the main feature and the neighboring features. Depending on the phase of the field produced by the neighboring features, the main feature critical dimension and process latitude can be improved by constructive light field interference, or degraded by destructive light field interference. The phase of the field produced by the neighboring features can be shown to be dependent on the pitch as well as the illumination angle. For a given illumination angle, the forbidden pitch lies in the location where the field produced by the neighboring features interferes with the field of the main feature destructively. The present invention provides a method for identifying the forbidden pitch regions (i.e., locations) for any feature size and any illumination condition. More importantly, the present invention provides a method for performing illumination design in order to suppress the forbidden pitch phenomena, thereby suppressing the negative effects associated therewith. In addition, the present invention provides for a method for utilizing scattering bar placement in conjunction with the suppression of the forbidden pitch phenomena to further minimize optical proximity effects and optimize overall printing performance.

As described in further detail below, the present invention provides significant advantages over the prior art. Most importantly, the present invention provides for identifying and eliminating forbidden pitch regions, which degrade the overall printing performance, thereby allowing for an improvement of the CDs and process latitude obtainable utilizing currently known photolithography tools and techniques.

It will be appreciated that in the present invention, the "mask pattern" may be embodied in a mask but may also be applied using another type of patterning means, examples of which are mentioned above. The term "mask pattern" is used herein for convenience but should not be construed as requiring the presence of a mask, unless the context otherwise requires.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

Additional advantages of the present invention will become apparent to those skilled in the art from the following detailed description of exemplary embodiments of the present invention.

BRIEF DESCRIPTION OF THE DRAWINGS

The invention itself, together with further objects and advantages, can be better understood by reference to the following detailed description and the accompanying drawings, in which:

FIG. 9 illustrates a flow chart detailing the process of generating the illumination map for a given pitch.

FIGS. 10a–10c show the illumination maps corresponding to the extreme interaction pitch regions of 480 nm, 560 nm, 635 nm illustrated in FIG. 8, respectively.

DETAILED DESCRIPTION OF THE INVENTION

Figure 1A:
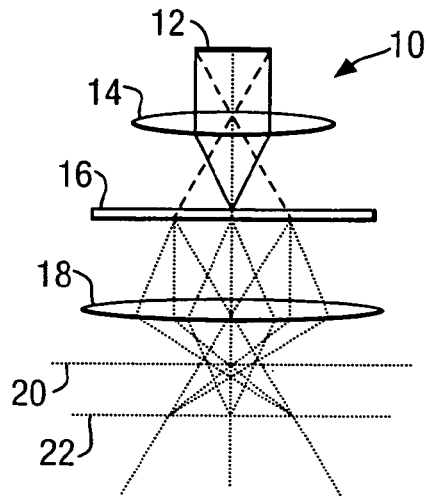
FIG. 1a illustrates an exemplary imaging system.

As explained in more detail below, the forbidden pitch phenomenon is a direct consequence of optical interactions between neighboring features. More specifically, the field phase of the neighboring feature relative to that of the main feature depends on the illumination angle and the separation distance between the features. For a given illumination angle, there are pitch ranges within which the field phase produced by the neighboring feature is substantially 180° out of phase relative to the field phase of the main feature, thereby resulting in destructive interference. Such destructive interference reduces the image contrast of the main feature, and as a result, causes a loss of exposure latitude. It is these pitch ranges, which cause destructive interference, that are referred to as the forbidden pitch ranges, and that are identified and eliminated by the methods of the present invention.

In accordance with the methods of the present invention, and as explained in detail below, the forbidden pitch regions (i.e., the extreme structural interaction pitch regions) are mapped out or identified utilizing an illumination map. In one embodiment, for each extreme structural interaction pitch, a corresponding illumination map is obtained, which shows its favorable illumination regions and its unfavorable illumination regions. As such, by utilizing the illumination maps the undesirable forbidden pitch regions can be eliminated. Furthermore, when the neighboring feature size is changed to the scattering bar size, similar constructive and destructive interference regions can be located and their corresponding illumination maps can also be obtained. Based on these illumination maps, the present invention also allows for optimal scattering bar placement to be determined for a given illumination condition.

Prior to discussing the details of the present invention, a brief review of the theory relevant to the method of the present invention is presented. In accordance with Fourier optics, the imaging process can be viewed as a double diffraction process under coherent illumination. The lens acts as the Fourier transform device that converts the geometrical information of the object (i.e., the reticle) into the spatial frequency information of the object in the frequency domain. The spatial frequency information of the object (i.e., frequency components and their amplitudes) is displayed at the exit pupil of the optical imaging system. If the linear dimensions of the geometrical figures on the object are much larger than the illumination wavelength, and the topology of the object is much smaller than the illumination wavelength, then the object can be viewed as purely geometrical and scalar diffraction theory is applicable.

The foregoing assumptions are currently considered valid for a reduction projection optical imaging system with a binary chrome reticle. In such cases, the electric field at the exit pupil is related to the transmission function of the object through the Fourier transformation. Although 4× or 5× reduction projection systems are utilized in practical photolithography systems, the following discussion utilizes a 1× system in order to simplify the analysis. The 1× optical imaging system avoids the complexity of information conversion from entrance pupil to exit pupil that is required for a 4× or 5× reduction optical imaging system, namely, the spatial frequency conversion, the field magnitude conversion and polarization tracking. It is noted, however, that the present invention is equally applicable to other systems, including a 4× or 5× reduction optical imaging system, or any other applicable system.

Figure 1B:
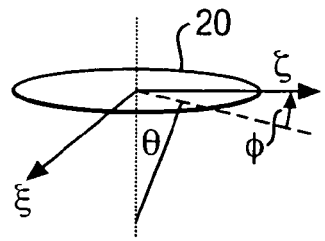
FIGS. 1b and 1c illustrate the transformation of an on-axis image point at the exit pupil into a corresponding point in the two-dimensional frequency plane.
Figure 1C:
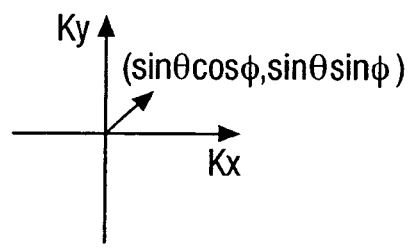

FIG. 1a illustrates an exemplary imaging system 10 helpful for describing the operation of the present invention. As shown, the imaging system 10 comprises a monochromatic light source 12, a condenser 14, a reticle 16, and a projection lens 18. As also shown, the imaging process generates an exit pupil 20 and an image plane 22. In the given system, the illumination scheme is Köhler illumination so that uniform illumination is achieved. Furthermore, if an adjustable aperture stop is placed at the back focal plane of the projection lens 18, then the back focal plane becomes the exit pupil because there are no optical elements between the back focal plane and the image plane. When examining the exit pupil from the on-axis image point, each geometrical point at the exit pupil 20 corresponds to a pair of angular coordinates $(\theta,\phi)$, which can be transformed into a corresponding point in the two-dimensional frequency plane through the following transformation, described by equation (1) and shown in FIGS. 1b and 1c.

$$k_x = \sin\theta \cos\phi, \; k_y = \sin\theta \sin\phi \tag{1}$$

Figure 2:
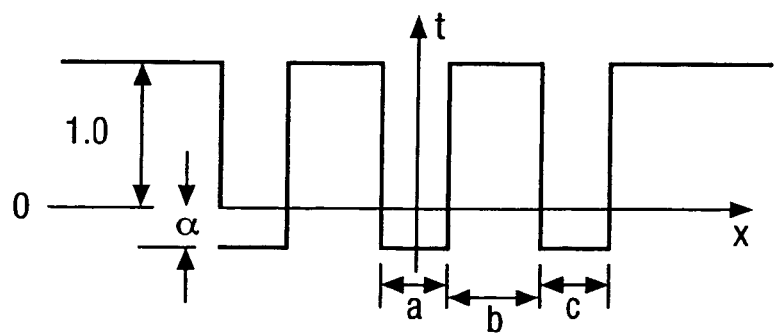
FIG. 2 represents an exemplary mask pattern to be printed on a wafer.

Now considering an object with a transmission function as shown in FIG. 2, such an object can be treated as a one-dimensional object, with its transmission function expressed as, $$f(x_o) = 1 - (1+\alpha)\left\{rect\left(\frac{x_o}{a}\right) + rect\left[\frac{x_o - (b+a/2+c/2)}{c}\right] + rect\left[\frac{x_o + (b+a/2+c/2)}{c}\right]\right\} \tag{2}$$

where $$rect\left(\frac{x_o}{a}\right) = \begin{cases} 1; & |x_o| < a/2 \\ 0; & |x_o| > a/2 \end{cases} \tag{3}$$

a is the width of the main feature (the center feature), c is the width of the side feature(s) and b is the edge-to-edge separation distance between the main feature and the side feature. The object illustrated in FIG. 2 represents a generalized mask pattern. When $\alpha=0$, it is a binary mask, $\alpha=\text{sqrt}(0.06)=0.24$ for a 6% attenuated phase shift mask, and $\alpha=1.0$ for a chrome-less phase shift mask.

Under on-axis coherent illumination ($\sin\theta=0$) with quasi-monochromatic light source, the field at the exit pupil is $$F(k_x) \propto \frac{1}{\lambda}\int_{-\infty}^{\infty} f(x_o) e^{-2\pi i k_x x_o/\lambda} dx_o \tag{4}$$

where $k_x = \sin\theta$ is the spatial frequency in the frequency plane along the $k_x$ axis. It is noted that by a quasi-monochromatic light source, it is meant that the coherence length of the light is much longer than the optical path difference between any pair of light rays under consideration. This approximation holds well for light sources used in photolithography, especially the KrF excimer light source with its bandwidth less than 1.0 picometer.

Figure 3A:
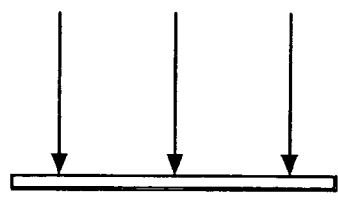
FIGS. 3a–3d illustrate exemplary results of both on-axis illumination and off-axis illumination.
Figure 3C:
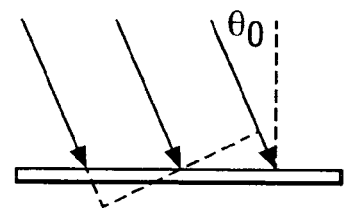
Figure 3B:
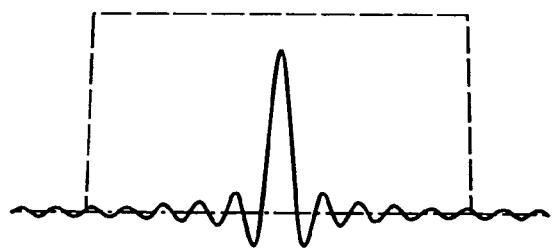
Figure 3D:
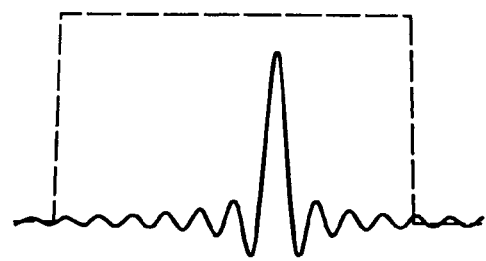

FIGS. 3a–3d illustrate the results of both on-axis illumination and off-axis illumination along the x-axis. As shown in FIGS. 3a and 3b, under on-axis illumination, the spectrum of the object is centered. However, under off-axis illumination along the x-axis, as shown in FIGS. 3c and 3d, the spectrum of the object is shifted relative to the exit pupil, and the field at the exit pupil becomes, $$F(k_x) \propto -\frac{i}{\lambda}\int_{-\infty}^{+\infty} f(x_o)e^{2\pi i k_{xo}x_o/\lambda}e^{-2\pi i k_x x_o/\lambda}dx_o \quad (5)$$

where $k_{xo}=\sin\theta_o$ and $\theta_o$ is the illumination angle. The phase term $e^{2\pi i k_{xo}x_o/\lambda}$ has a simple geometrical interpretation, and accounts for the phase difference of the illumination field at different object points, as illustrated in FIG. 3c.

By inserting equation (2) into equation (5), the result is:

$$F(k_x) \propto \delta(k_x - k_{xo}) - (1+\alpha)\left\{\frac{a}{\lambda}\frac{\sin\left[\pi\frac{a}{\lambda}(k_x - k_{xo})\right]}{\pi\frac{a}{\lambda}(k_x - k_{xo})} + \right. \quad (6)$$

$$e^{-2\pi i p(k_x - k_{xo})/\lambda}\frac{c}{\lambda}\frac{\sin\left[\pi\frac{c}{\lambda}(k_x - k_{xo})\right]}{\pi\frac{c}{\lambda}(k_x - k_{xo})} +$$

$$\left. e^{-2\pi i p(k_x - k_{xo})/\lambda}\frac{c}{\lambda}\frac{\sin\left[\pi\frac{c}{\lambda}(k_x - k_{xo})\right]}{\pi\frac{c}{\lambda}(k_x - k_{xo})}\right\}$$

where $p=b+a/2+c/2$ is defined as the pitch of the pattern.

The electric field at the image plane, according to Fourier optics, is $$g(x_i) \propto \frac{1}{\lambda}\int_{-NA}^{+NA} F(k_x)e^{2\pi i k_x x_i/\lambda}dk_x \quad (7)$$

It is noted that the quantities set forth in equations (6) and (7) can be rescaled such that all the geometrical dimensions are normalized to $\lambda/NA$, and $k_x$ and $k_{xo}$ are normalized to NA. Explicitly, these rescaled quantities can be expressed as, $$a_r = a \cdot NA/\lambda, \ b_r = b \cdot NA/\lambda, \ c_r = c \cdot NA/\lambda, \ p_r = p \cdot NA/\lambda \quad (8)$$

$$x_i^r = x_i \cdot NA/\lambda, \ k_x^r = k_x/NA, \ k_{xo}^r = k_{xo}/NA = s$$

Using these rescaled quantities, the electric field at the image plane becomes:

$$g(x_i^r) \propto e^{2\pi i x_i^r s} - \quad (9)$$

$$(1+\alpha)\int_{-1}^{+1}\left\{a_r\frac{\sin[\pi a_r(k_x^r - s)]}{\pi a_r(k_x^r - s)} + \right.$$

$$e^{-2\pi i p_r(k_x^r - s)}c_r\frac{\sin[\pi c_r(k_x^r - s)]}{\pi c_r(k_x^r - s)} +$$

$$\left. e^{2\pi i p_r(k_x^r - s)}c_r\frac{\sin[\pi c_r(k_x^r - s)]}{\pi c_r(k_x^r - s)}\right\}e^{2\pi i x_i^r k_x^r}dk_x^r$$

or $$g(x_i^r) \propto e^{2\pi i x_i^r s} - \quad (9')$$

$$(1+\alpha)\int_{-1}^{+1}\left\{a_r\frac{\sin[\pi a_r(k_x^r - s)]}{\pi a_r(k_x^r - s)}\right\}e^{2\pi i x_i^r k_x^r}dk_x^r -$$

$$(1+\alpha)e^{2\pi i p_r s}\int_{-1}^{+1}\left\{c_r\frac{\sin[\pi c_r(k_x^r - s)]}{\pi c_r(k_x^r - s)}\right\}e^{2\pi i(x_i^r - p_r)k_x^r}dk_x^r -$$

$$(1+\alpha)e^{-2\pi i p_r s}\int_{-1}^{+1}\left\{c_r\frac{\sin[\pi c_r(k_x^r - s)]}{\pi c_r(k_x^r - s)}\right\}e^{2\pi i(x_i^r + p_r)k_x^r}dk_x^r$$

where s is related to the illumination angle. From equation (9'), it is clear that the fields produced by the side features have a phase term $e^{\pm 2\pi i p_r s}$. It is this phase term that plays the central role in the determination and elimination of the forbidden pitch regions.

It is noted that equation (9) or (9') applies for one-dimensional illumination. However, as shown below, the two-dimensional illumination used in photolithography can be approximated as a one-dimensional illumination for long lines or trench structures.

Figure 4A:
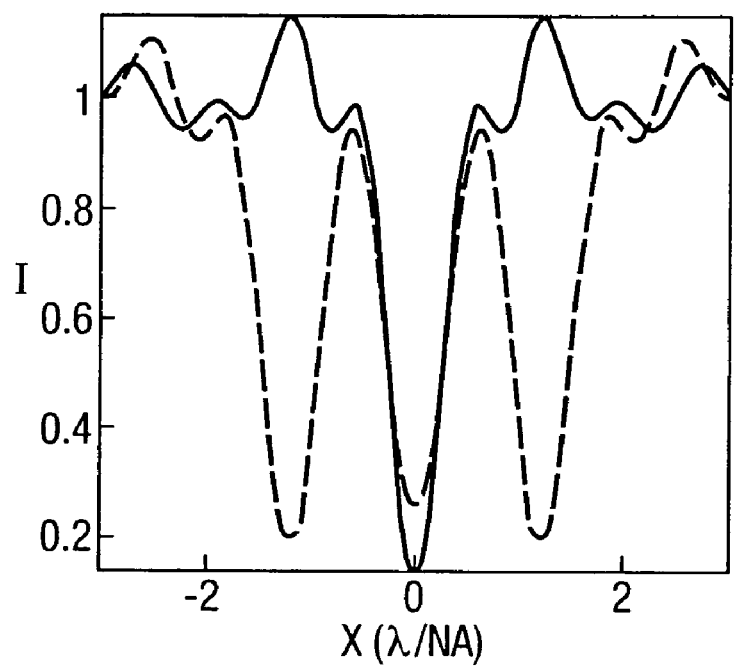
FIGS. 4a and 4b illustrate an exemplary interaction between side features and the main feature at two different pitches under a specific illumination angle.
Figure 4B:
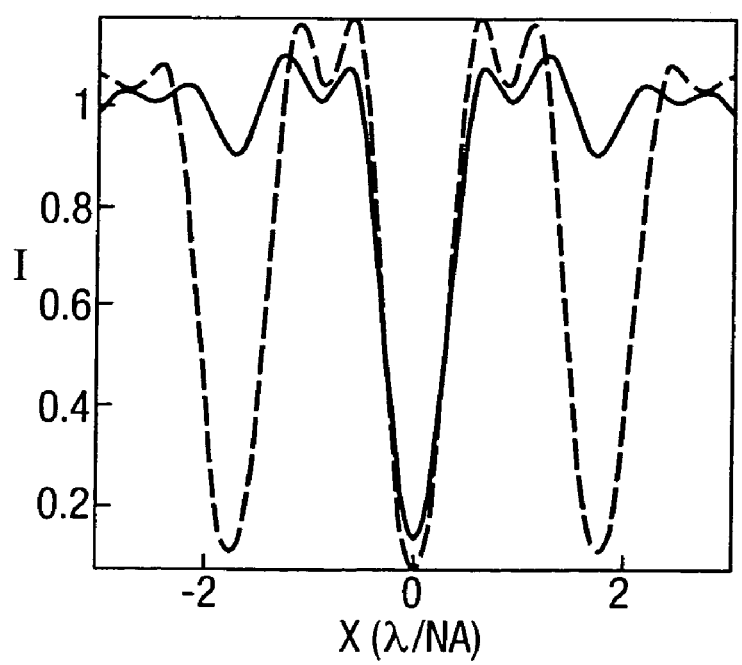

As detailed above, it has been determined that under certain illumination conditions there are some pitch regions within which the exposure latitudes of the main feature become very small, even smaller than that of the isolated feature. Such pitch regions are referred to as forbidden pitch regions, and are caused by destructive interaction between the main feature and the side features under those illumination conditions. Whether the existence of the side features will improve the process latitude of the main feature or degrade the process latitude of the main feature depends on the fields produced by these side features at the main feature Gaussian image point. If the fields of the side features have the same phases as the field of the main feature at the main feature image location, then constructive interference between these fields can improve the process latitude of the main feature. If the fields of the side features have 180° phase difference with respect to the field of the main feature at the main feature image location, then destructive interference between the fields causes degrading of the process latitude for the main feature. The forbidden pitch regions lie in the locations where destructive interference occurs under a given illumination condition. When such situations arise, the process latitude of the main feature is worse than that of the isolated feature. Since the field signs (depending on phases) and their magnitudes from the side features are determined by the pitch, the illumination angle (s) and the numerical aperture (NA), constructive and destructive interaction pitch regions can be located using equation (9'). FIGS. 4a and 4b show examples of the interaction between side features and the main feature at two different pitches under a specific illumination angle. In the given examples, the feature size is 130 nm, NA=0.65, and s=0.4 for a binary mask ($\alpha=0$). As illustrated in FIG. 4a, at a pitch of approximately 470 nm, the minimum intensity of the main feature (dashed line) at its Gaussian image point is higher than that of an isolated feature (solid line), leading to a lower image contrast and smaller exposure latitude. As shown in FIG. 4b, at a pitch of approximately 680 nm, the minimum intensity of the main feature (dashed line) at its Gaussian image point is lower than that of an isolated feature (solid line), leading to a higher image contrast and larger exposure latitude.

Figure 5:
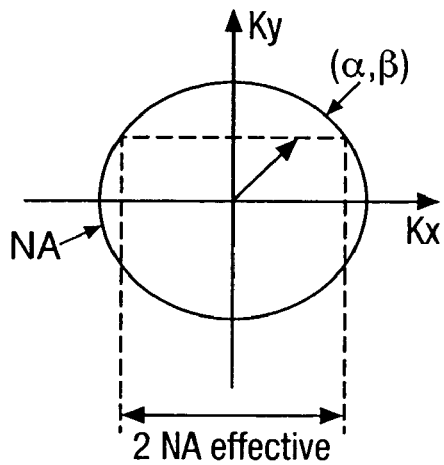
FIG. 5 is a graph representing two-dimensional illumination.

As noted above, the foregoing analysis of forbidden pitch regions is based on one-dimensional illumination, i.e. ($k_y=0$). In actuality, the illumination schemes implemented in photolithography are two-dimensional. However, for structures that can be approximated as one-dimensional, such as very long lines or trenches, the two-dimensional illumination problem can be reduced to a one-dimensional problem. The foregoing is illustrated utilizing FIG. 5. Referring to FIG. 5, assuming the structures are infinitely long in the y direction, the Fourier transform spectrum of the structure at the exit pupil will have zero width in the $k_y$ direction. Under this scenario, a two-dimensional illumination (NA, $k_x$, $k_y$) is equivalent to a one-dimensional illumination (NA$_{effective}$, s$_{effective}$). The relationship between the two-dimensional illumination and its corresponding one-dimensional illumination is readily derived, $$NA_{effective} = \sqrt{NA^2 - \beta^2} \quad (10)$$

$$S_{effective} = \frac{\alpha}{\sqrt{NA^2 - \beta^2}}, \beta < NA$$

where NA in equation (10) is the numerical aperture setting in the employed lithographic projection apparatus.

Figure 6:
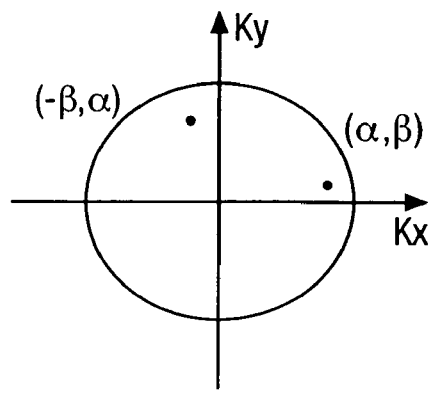
FIG. 6 is a graph representing the conjugated illumination scheme required for vertical and horizontal feature performance balance.

Further detailed analysis on the forbidden pitch phenomenon and optimal illumination design for suppressing forbidden pitch regions has to take into account the performance balance between "vertical" and "horizontal" features (i.e., features in the y and x direction). To achieve this performance balance, an illumination source point ($\alpha$, $\beta$) in the ($k_x>0$, $k_y>0$) illumination space must have a corresponding conjugated illumination source point ($-\beta$, $\alpha$) in the ($k_x<0$, $k_y>0$) illumination space, as shown in FIG. 6. Such performance balance between "vertical" and "horizontal" features is required for single exposure schemes, which is widely used today. However, in multiple exposure schemes such as dipole illumination a double exposure scheme conjugated illumination source point is not required. Nevertheless, the theory and methodology outlined below can also be applied to multiple exposure schemes with some modifications based on the illumination scheme employed. For a single exposure scheme, each illumination point in the first quadrant exhibits a 90 degree rotational symmetry with a corresponding illumination point in the second quadrant. In other words, each illumination point in the first quadrant exhibits a 90 degree rotational symmetry with a corresponding illumination point in the second quadrant. Similarly, in the reduced one-dimensional illumination space, any illumination source point ($NA_{effective}$, $S_{effective}$) must have a conjugated illumination point ($\sqrt{NA^2 - NA_{effective}^2 S_{effective}^2}$, $-\sqrt{NA^2 - NA_{effective}^2}/\sqrt{NA^2 - NA_{effective}^2 S_{effective}^2}$).

Figure 7:
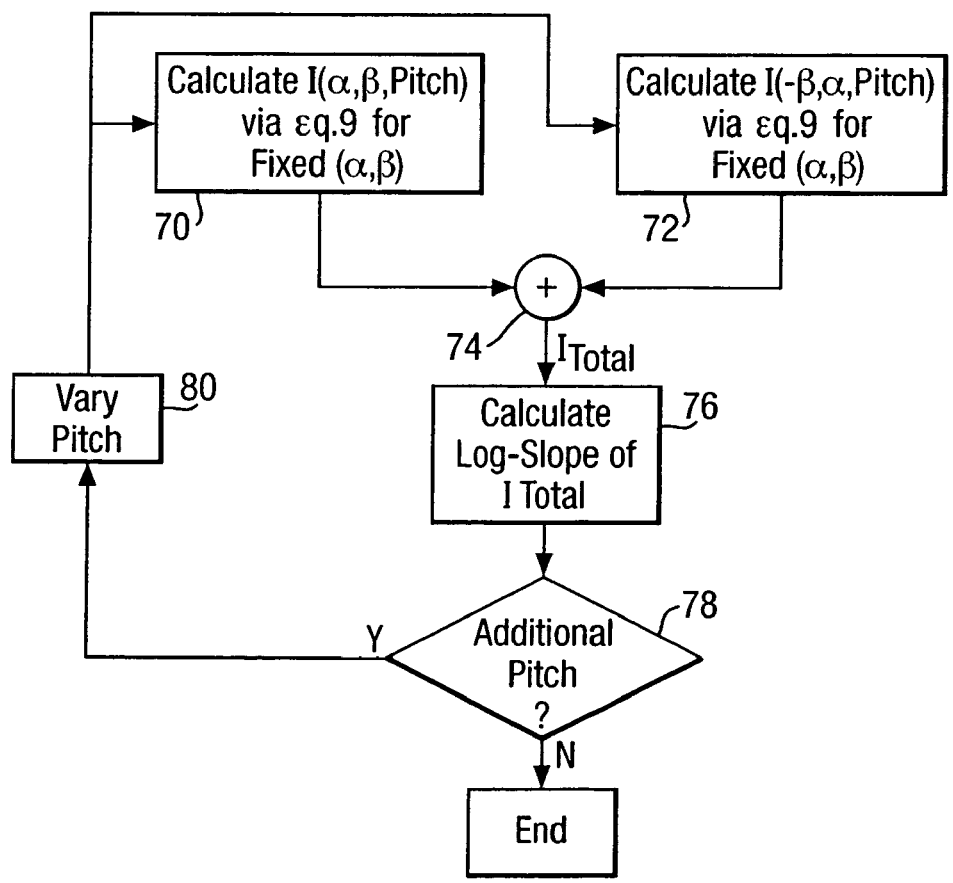
FIG. 7 illustrates a flow chart detailing the process of defining/identifying the forbidden pitch regions.

Utilizing this conjugated illumination scheme, the forbidden pitch regions can be identified and eliminated. FIG. 7 illustrates a flow chart detailing the process of defining/identifying the forbidden pitch regions. The first portion of the process entails determining the interaction pitch regions for a given ($\alpha$, $\beta$). Referring to FIG. 7, this is accomplished by utilizing equation 9 or 9', which as explained above represents the calculation engine associated with one-dimensional illumination. More specifically, for a given illumination point (i.e., $\alpha$, $\beta$ are fixed), equation 9 or 9' is utilized to calculate the illumination intensity at a given pitch, I($\alpha$, $\beta$, pitch) (Step 70). In addition, equation 9 or 9' is utilized to calculate the illumination intensity of the corresponding 90 degree rotational symmetric point at the same pitch, I($-\beta$, $\alpha$, pitch) (Step 72). The two illumination intensities are then added together (Step 74) to obtain $I_{total}$ ($\alpha$, $\beta$, pitch), and then the log-slope of $I_{total}$ is calculated (Step 76). This process is then repeated for each pitch of interest, I($\alpha$, $\beta$, pitch) (Steps 78, 80).

Figure 8:
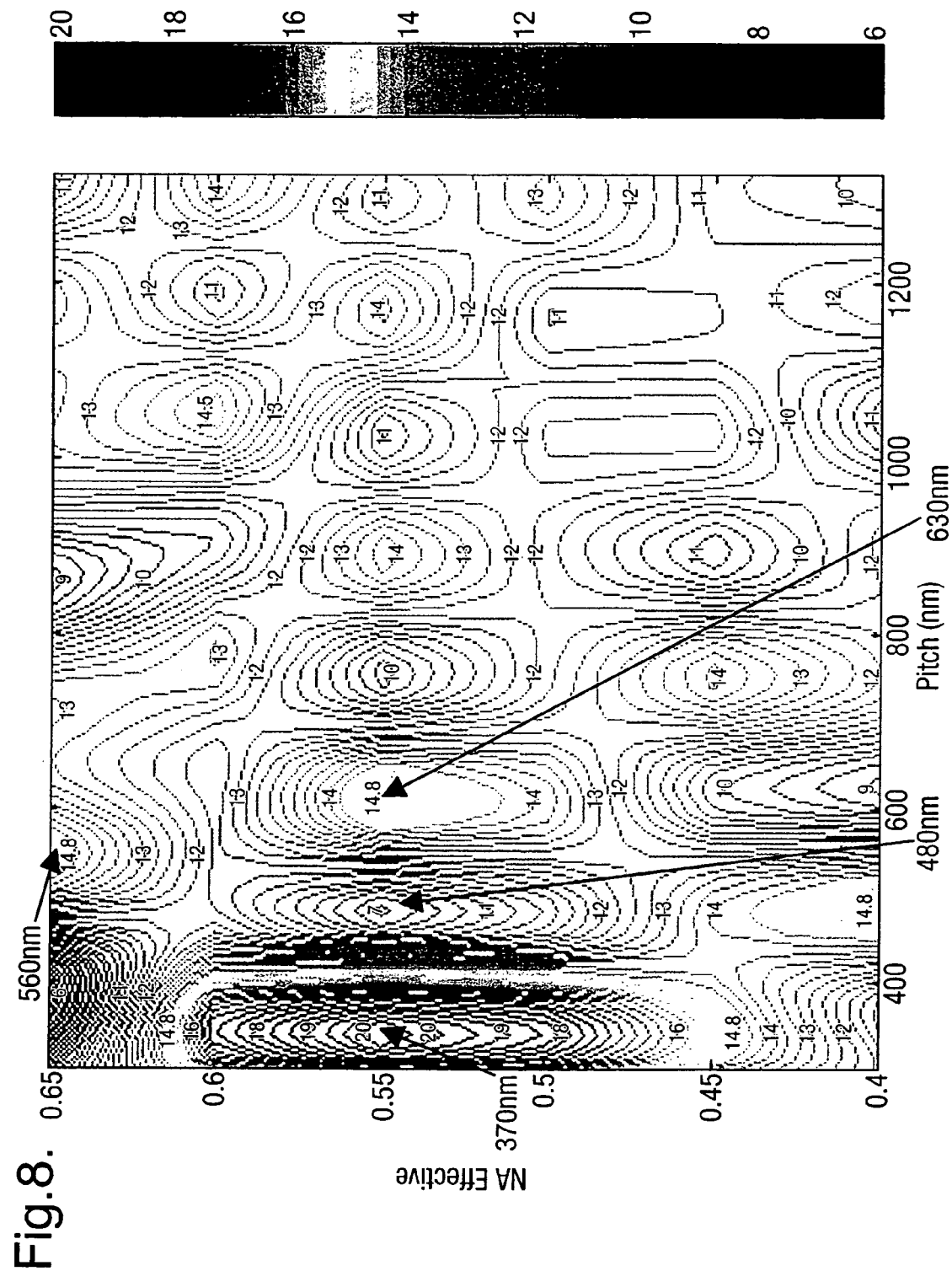
FIG. 8 is a plot resulting from the process of FIG. 7, which illustrates the extreme interaction pitch regions.

FIG. 8 illustrates a plot of the results of the process of FIG. 7, which depicts the areas having extreme interaction pitch regions. Referring to FIG. 8, the extreme pitch interaction locations are identified by those areas having a substantial amount of circles. More specifically, the extreme pitch interaction locations can be identified utilizing the following equation:

$$d(\text{log-slope of } I_{total})/d(\text{pitch}) \sim 0. \quad (11)$$

In particular, the locations substantially proximate the location satisfying the foregoing equation are extreme pitch interaction locations. In other words, while the foregoing condition for locating the extreme pitch interaction locations specifies a specific location, the actual forbidden pitch is a range around this location. The actual range is dependent on the wavelength and the NA of the exposure apparatus. From experimental studies, it was determined that the forbidden pitch range around a given specific location is approximately +/−0.12 wavelength/NA. For example, if exposure apparatus utilizes a 248 nm source and a NA=0.65, then the extreme interaction pitch range is approximately +/−45 nm. It is further noted that while the extreme interaction pitch locations are relatively stable, they are not stationary. Extreme interaction pitch locations can shift slightly with variations in illumination angle.

Returning to FIG. 8, it is noted that the example set forth in FIG. 8 was conducted utilizing a set feature size of 130 nm, a scanner NA=0.65, and s effective=0.65. As shown, there are four distinct extreme interaction pitch regions in the intermediate pitch range (300 nm to 700 nm), which are located at approximately 370 nm, 480 nm, 560 nm and 630 nm. It is further noted that FIG. 8 does not indicate whether the extreme interaction pitch regions are constructive or destructive, but just whether or not such regions exist. Also, typically the extreme interaction pitch regions do not vary appreciably with the illumination angle. The regions tend not to be very sensitive to illumination angle.

Once the extreme interaction pitch regions are identified, the next portion of the process entails generating illumination maps for the pitches of interest/concern (i.e., the extreme interaction pitch regions). To summarize, for each extreme interaction pitch region, the log-slope of the main feature image at the mask edge is calculated as a function of illumination angle. FIG. 9 illustrates a flow chart detailing the process of generating the illumination map for a given extreme interaction pitch.

Figure 10C:
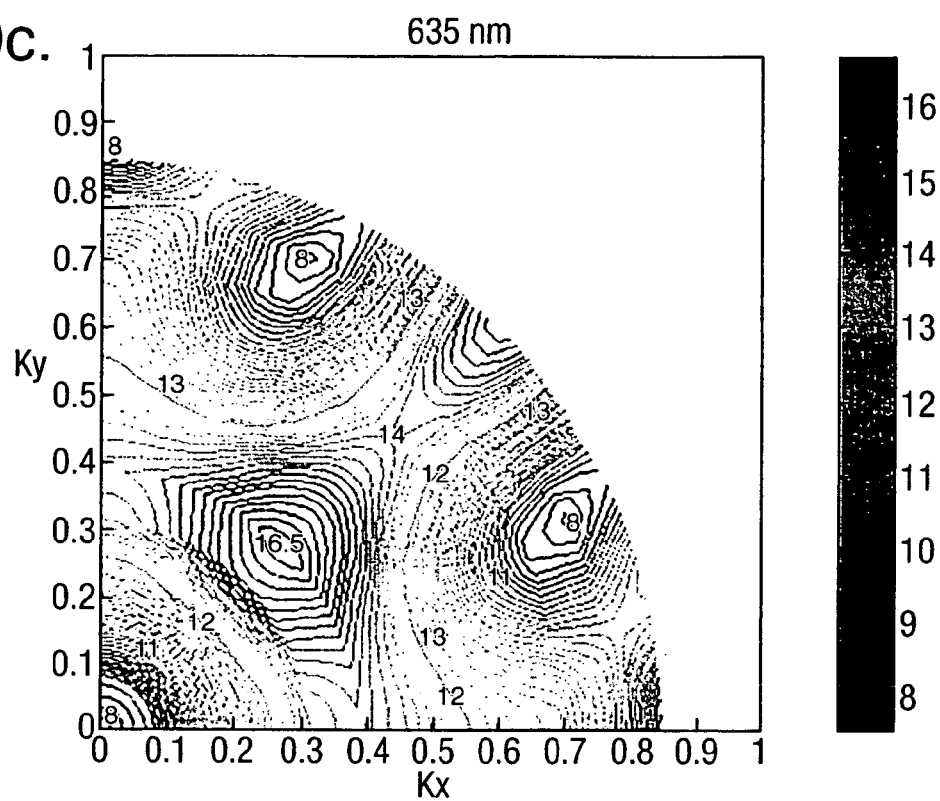
Figure 10D:
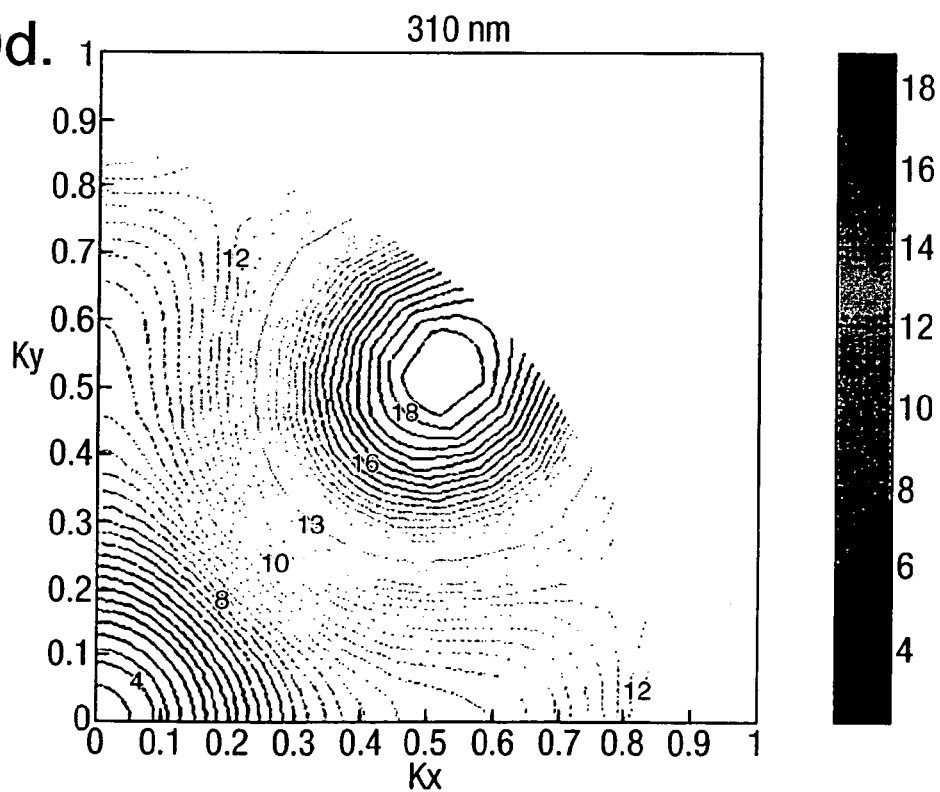
FIG. 10d illustrates the illumination map corresponding to the pitch of 310 nm.

Referring to FIG. 9, again utilizing equation 9 or 9', the illumination intensity for a first illumination angle ($\alpha$, $\beta$) and the fixed pitch is calculated (Step 90), and the illumination intensity of the corresponding 90 degree rotational symmetric point at the same pitch is calculated (Step 92). The two illumination intensities are then added together (Step 94) to obtain $I_{total}$ ($\alpha$, $\beta$, pitch), and then the log-slope of $I_{total}$ is calculated (Step 96). This process is then repeated for a plurality of illumination angles so as to allow the illumination map to cover at least one quadrant (i.e., $0 \leq k_x \leq 1$, $0 \leq k_y \leq 1$), (Steps 98, 100). FIGS. 10a–10c show the illumination maps corresponding to the extreme interaction pitch regions of 480 nm, 560 nm, 635 nm illustrated in FIG. 8, respectively. FIG. 10d illustrates the illumination map corresponding to the minimum pitch of 310 nm.

Referring again to FIGS. 10a–10d, the illumination angles corresponding to higher values of the log-slope of $I_{total}$ are the illumination angles that provide optimal performance for the given pitch. In other words, the higher the value of the log-slope of $I_{total}$, the better the performance. For example, referring to FIG. 10a, the optimal illumination angle for this pitch (i.e., 480 nm) is approximately zero. Any illumination angle corresponding to values of $k_x > 0.2$ and $k_y > 0.2$ result in low values of the log-slope of $I_{total}$, and are therefore undesirable. As shown in FIG. 10a, the highest values of the log-slope occur when both $k_x$ and $k_y$ are approximately zero. Referring to FIG. 10b, the optimal illumination angles for the 560 nm pitch are angles corresponding approximately to either $k_x=0.5$ and $k_y=0$, or $k_x=0$ and $k_y=0.5$. Referring to FIG. 10c, the optimal illumination angles for the 635 nm pitch are angles corresponding approximately to $k_x$=0.3 and $k_y$=0.3. Finally, referring to FIG. 10d, the optimal illumination angles for the 310 nm pitch are angles corresponding to either $k_x$=0.5 and $k_y$=0.5.

Accordingly, from the illumination maps, it is clear that whether an extreme interaction pitch becomes a forbidden pitch region or a friendly pitch region depends on the illumination employed. Further examination of the illumination maps reveals that the illumination map at pitch 480 nm is complementary to the illumination maps at 635 nm and 310 nm. More specifically, at pitch 480 nm, the desirable illumination angles correspond to $k_x$ and $k_y$ equal to approximately zero, and the undesirable areas correspond to $k_x$ and $k_y$ equal to approximately 0.5. Conversely, at pitches of 635 nm and 310 nm, the desirable illumination angles correspond to $k_x$ and $k_y$ equal to approximately 0.5, and the undesirable areas correspond to $k_x$ and $k_y$ equal to approximately 0. This intrinsic complementary property prevents taking advantage of the quadrupole illumination for 130 nm mode photolithography unless there are no structures around 480 nm pitch on the layer. Analysis of the foregoing illumination maps allows the designer to select the illumination angle(s) to be utilized so as to optimize the printing performance, and more importantly, to avoid the extreme interaction pitch areas which result in destructive interference.

It is noted that the minimum value of the log-slope of $I_{total}$ associated with acceptable performance depends in-part on the resist being utilized. For example, different resists exhibit different contrasts, which require different minimum values of the log-slope of $I_{total}$ corresponding to optimal performance regions. As a general rule, however, a value of the log-slope of $I_{total}$ approximately equal to a greater than 15 results in an acceptable process.

With regard to optimizing printing performance, referring to the exemplary illumination maps set forth in FIGS. 10a–10d, it is noted that in comparison with quadrupole illumination, annular illumination ($\sigma\_in$=0.55 and $\sigma\_out$=0.85, for example) can improve image contrast around the 480 nm pitch region by degrading the image contrast at other pitch regions. Such an approach reduces the structural interactions at different pitches by averaging the constructive and destructive interactions within the illumination space.

Figure 11:
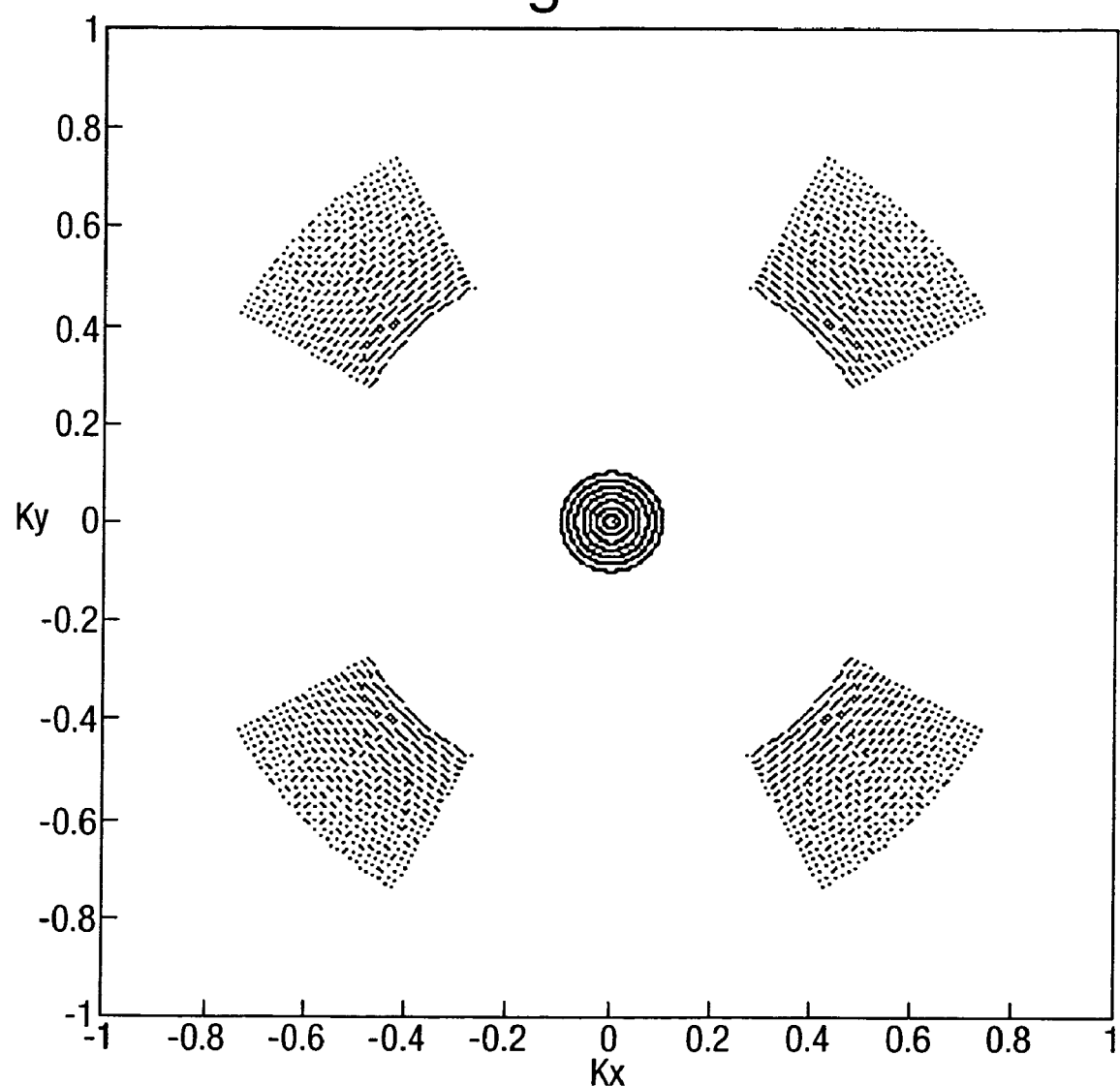
FIG. 11 illustrates an illumination design that improves the exposure latitude at the 480 nm pitch region while preserving strong constructive structural interactions at other pitch regions.
Figure 12:
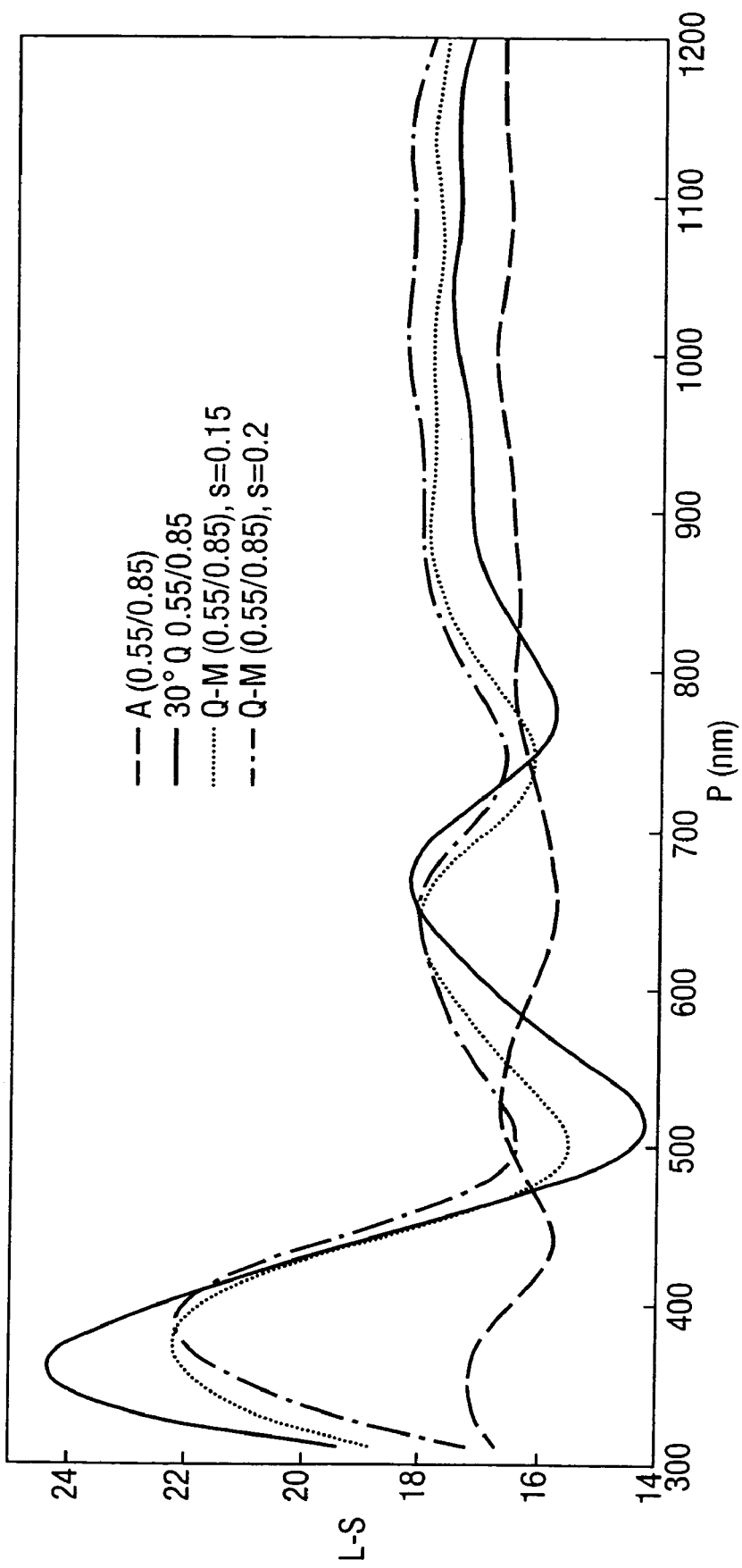
FIG. 12 is a graph illustrating a comparison of the log-slope values associated with annular, quadrupole and the modified quadrupole illumination.

For example, FIG. 11 illustrates an illumination design that improves the exposure latitude at the 480 nm pitch region while preserving strong constructive structural interactions at other pitch regions. More specifically, FIG. 11 illustrates an illumination design that provides some illumination at the illumination center since the favorable illumination for the 480 nm pitch region is around center ($k_x$=0, $k_y$=0). However, the performance balance has to be considered when illumination at center is added, because the illumination at the center will unavoidably degrade the image contrast at the minimum pitch region at 310 nm. Comparison of the log-slope using Solid-C simulation software on annular, quadrupole and the modified quadrupole illumination ($\sigma\_center$=0.15 and $\sigma\_center$=0.2) is shown in FIG. 12. The features are 130 nm lines on a 6% attenuated phase shift mask. As shown from the simulation results, the modified quadrupole with center $\sigma$=0.2 will provide an overall better process, and it also allows taking full advantage of the assist feature benefits.

It is noted that the term QUASAR used in the figures refers to the generation of quadrupole illumination using a Diffractive Optical Element (DOE), which re-distributes incoming radiation flux rather than blocking/passing it. In particular, 30-degree QUASAR refers to a quadrupole pattern in which the 4 poles are segments of an annulus, and each subtends an angle of 30 degrees with the center of the annulus.

It is also possible to utilize the foregoing illumination maps to assist in the placement of scattering bars, which operate to mitigate optical proximity effects. The use of such scattering bars has been described in U.S. Pat. No. 5,242,770 noted above. As detailed in the '770 patent, it is has been known that adding assist features around sparse (e.g. isolated) features is necessary for aggressive printing in photolithography in order to achieve a manufacturable process. However, the placements of such assist features are very critical for achieving the optimal and desired effect. More specifically, similar to adjacent features, it is possible for incorrect placement of scattering bars around the main feature to degrade the process latitude of the main feature. For example, if the scattering bar is placed in a forbidden pitch region. Accordingly, the present invention can also be utilized for the placement of scattering bars so as to assure that the scattering bars are not positioned in a forbidden pitch region for a given illumination angle.

The implementation of scattering bar technology involves the determination of scattering bar size and placement. Although the largest scattering bar size should be used within the resist contrast capability, the practical design has to take other factors into account, such as the dimension errors of scattering bars resulting from the mask-making process. Current scattering bar size is typically around 60–80 nm. The scattering bar placement is mainly based on the placement rules that are developed from experiments, using a specially designed reticle such as MaskTools's LINESWEEPER™ reticle. The principle of scattering bar placement is similar to that of forbidden pitch phenomena described above.

Figure 13:
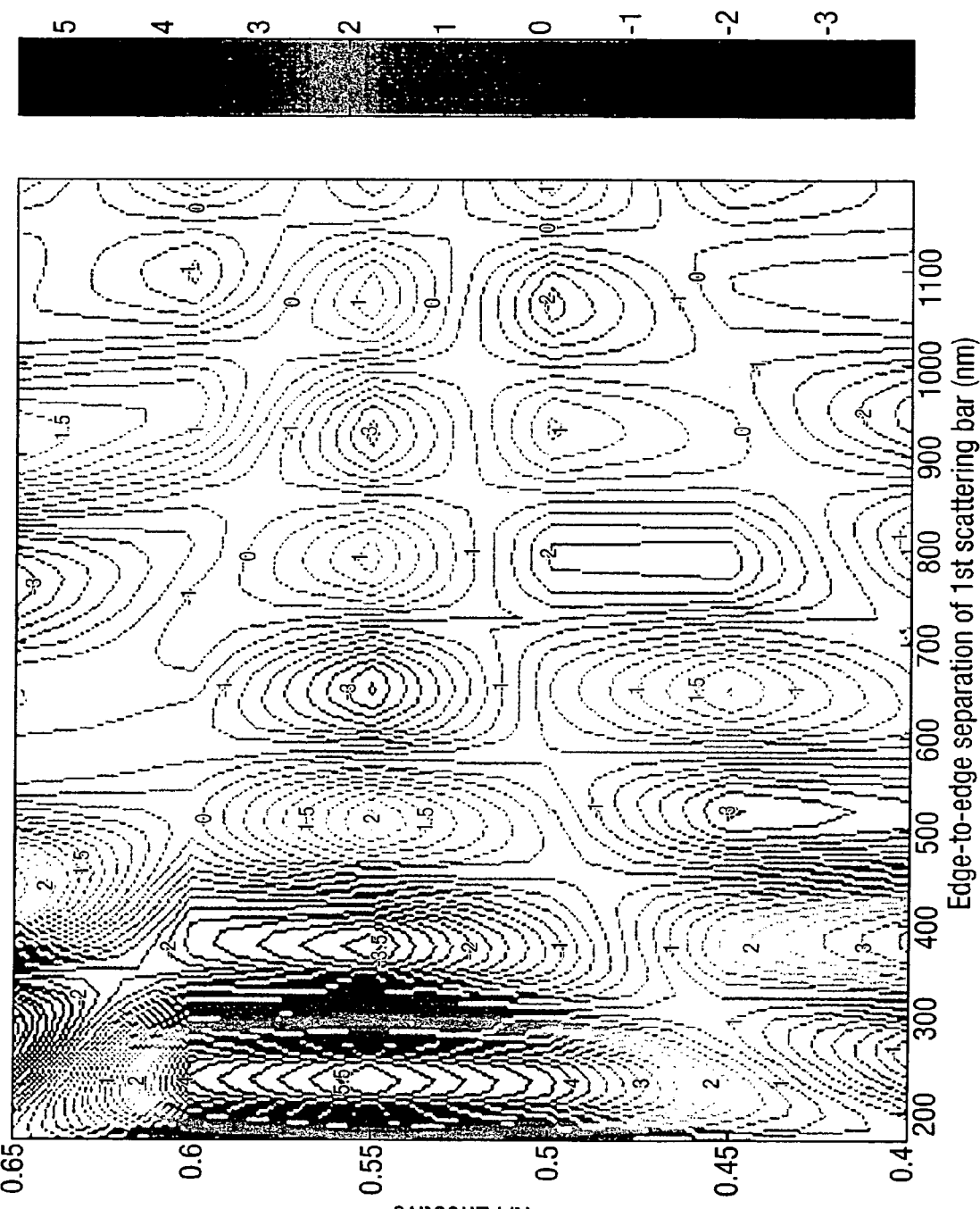
FIG. 13 shows the extreme interaction edge-to-edge placement positions of the scattering bars around an isolated main line.
Figure 14A:
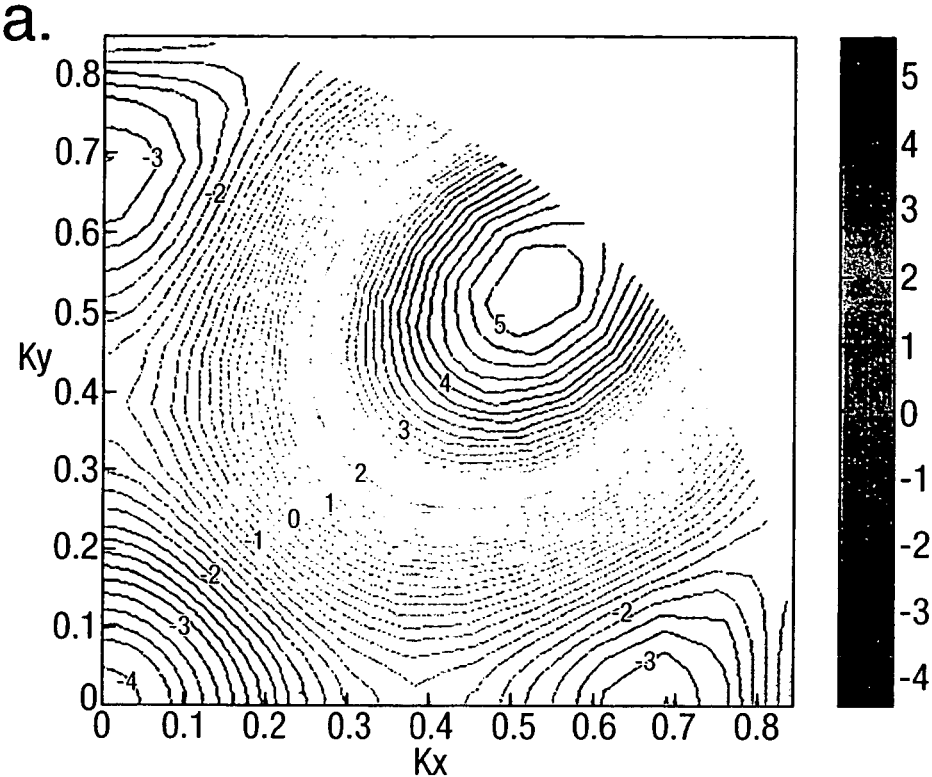
FIGS. 14a–d are illumination maps for scattering bars having varying separation from a main feature.
Figure 14B:
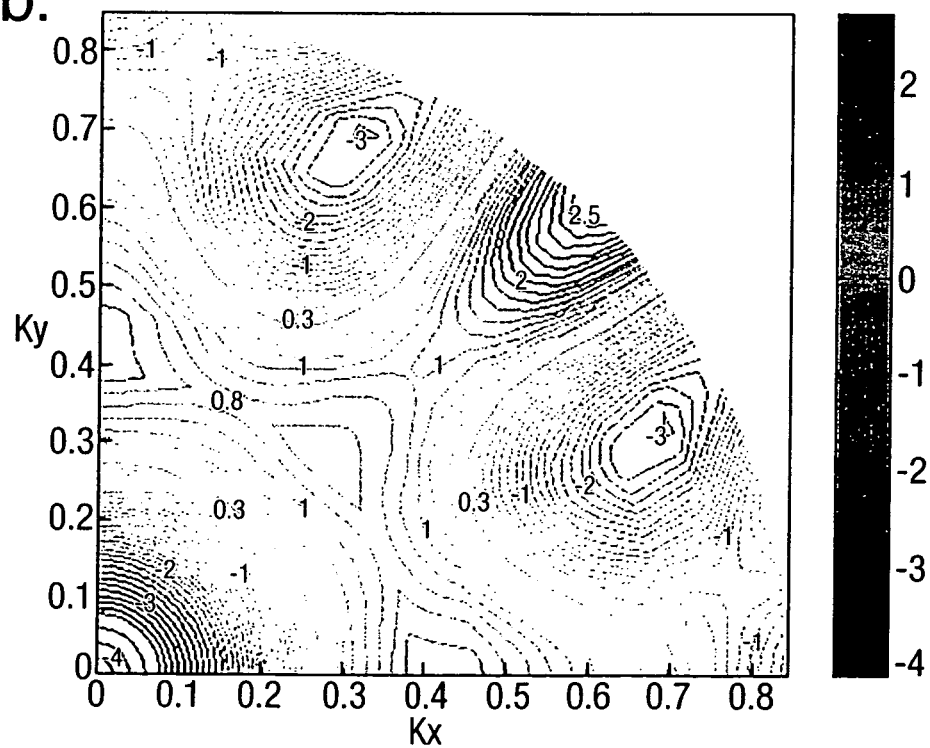
Figure 14C:
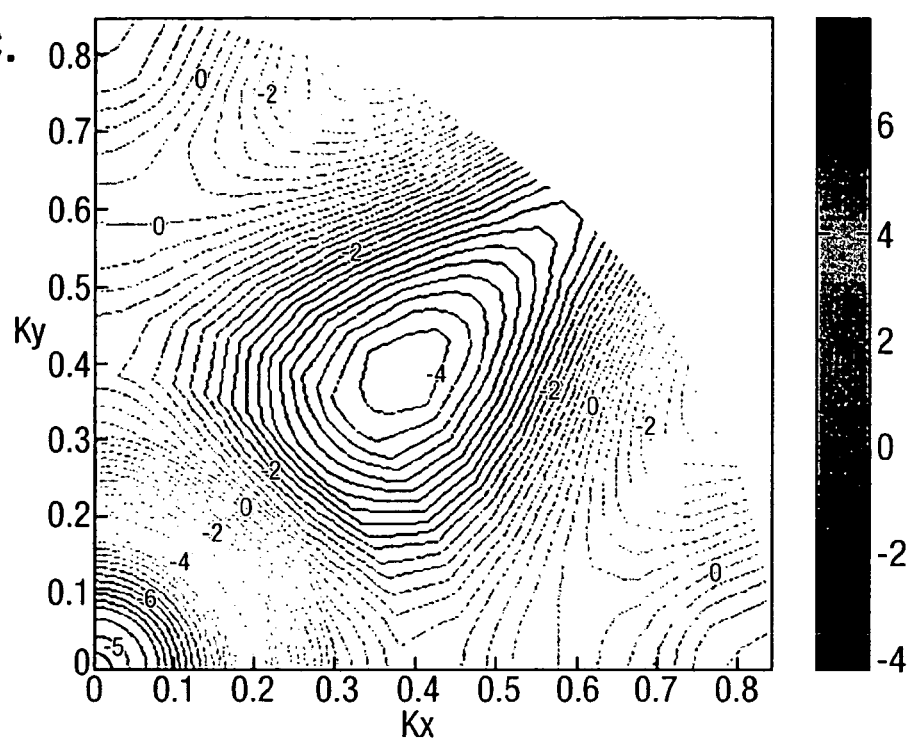
Figure 14D:
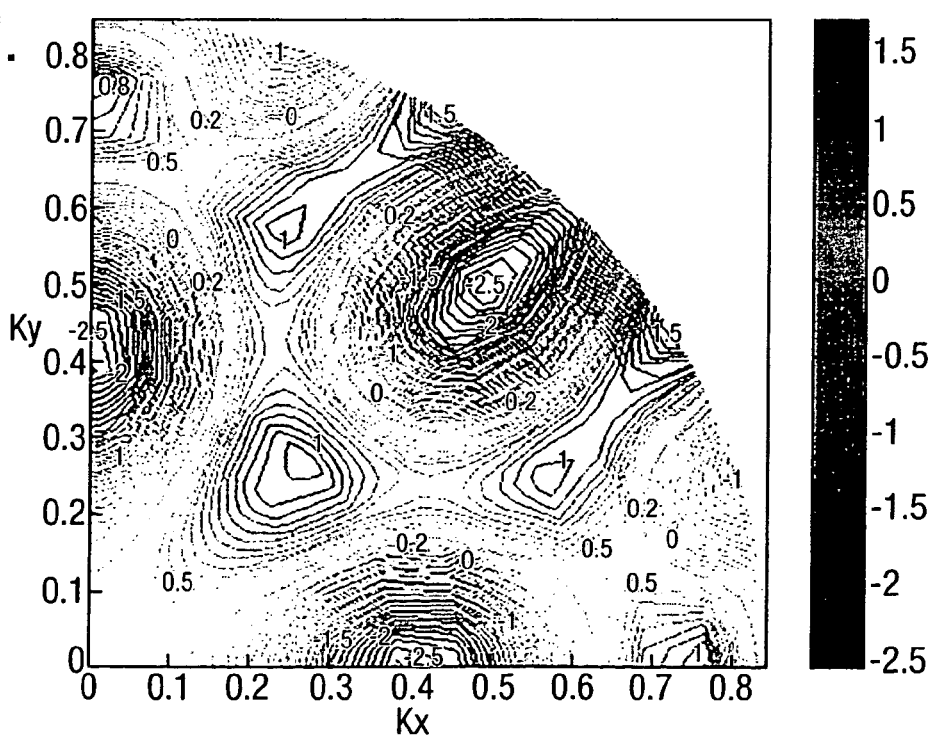

More specifically, the first step entails identifying the extreme interaction locations between the scattering bars and the main features. The process for identifying the extreme interaction locations is substantially the same as the process described above for identifying the extreme interaction pitch regions. However, instead of identifying small log-slope regions as is necessary for identification of forbidden pitch regions, regions that show large log-slope for the main feature are identified. FIG. 13 shows the extreme interaction edge-to-edge placement positions of the scattering bars around an isolated main line. As shown, these extreme edge-to-edge positions are around 235 nm, 375 nm, 510 nm, 655 nm, etc.

Once the extreme interaction locations are identified, the next step is to select the ones that have a similar illumination map to the illumination conditions already selected for the process. It is noted that it is not always true that the closer the scattering bar is placed around the main isolated feature the better, since each placement position has its own favorable illumination region. FIGS. 14a–d are illumination maps generated for scattering bars having varying separation from the main feature. Referring to FIGS. 14a–14d, strong scattering bar effects are expected when scattering bars are placed around 235 nm or 510 nm. However, improper placement of scattering bars around 375 nm or 650 nm will degrade the image contrast of the main isolated feature under quadrupole illumination. If space is provided around the sparse features, a second pair of scattering bars can be added. When annular illumination is utilized, constructive and destructive structural interactions from scattering bars will be averaged out to some degree, and the benefit from the assist features is therefore greatly reduced. Thus, it is clear from the foregoing that placement of scattering bars is strongly dependent on the illumination chosen. It is also noted that when multiple scattering bars are required, their illumination maps should belong to the same class (i.e., the illumination maps should be similar).

To summarize, because both the forbidden pitch phenomena and the scattering bar technology are a direct consequence of optical interactions between neighboring features, they can be treated and understood under a unified framework. The foregoing makes clear that the field phase of the neighboring feature relative to that of the main feature depends on the illumination and the separation distance. For a given illumination angle, there are pitch ranges within which the field phase produced by the neighboring feature is 180° out of phase relative to the field phase of the main feature, resulting in destructive interference. Such destructive interference reduces the image contrast of the main feature, and therefore causes a loss of exposure latitude. The forbidden pitch regions, or more precisely the extreme structural interaction pitch regions, can easily be mapped out and determined as detailed above. For each extreme structural interaction pitch, a corresponding illumination map can be obtained, which shows its favorable illumination regions and its unfavorable illumination regions. The illumination maps are then utilized as a reference for illumination design. When the neighboring feature size is changed to the scattering bar size, similar constructive and destructive interference regions can be located and their corresponding illumination maps can also be obtained. Based on these illumination maps, the optimal scattering bar placement can be determined for a given illumination condition. Thus, in general, scattering bars should be placed at the pitch regions where fields from scattering bars are in phase with the field from the main feature at the main feature Gaussian image point under a given illumination condition. When the illumination scheme utilized is changed, the scattering bar placements should be adjusted accordingly. When multiple scattering bars are required, their illumination maps should have similarity to achieve maximum benefit.

As described above, the method of the present invention provides significant advantages over the prior art. Most importantly, the present invention provides for identifying and eliminating forbidden pitch regions, which degrade the overall printing performance, thereby allowing for an improvement of the CDs and process latitude obtainable utilizing currently known photolithography tools and techniques.

Figure 15:
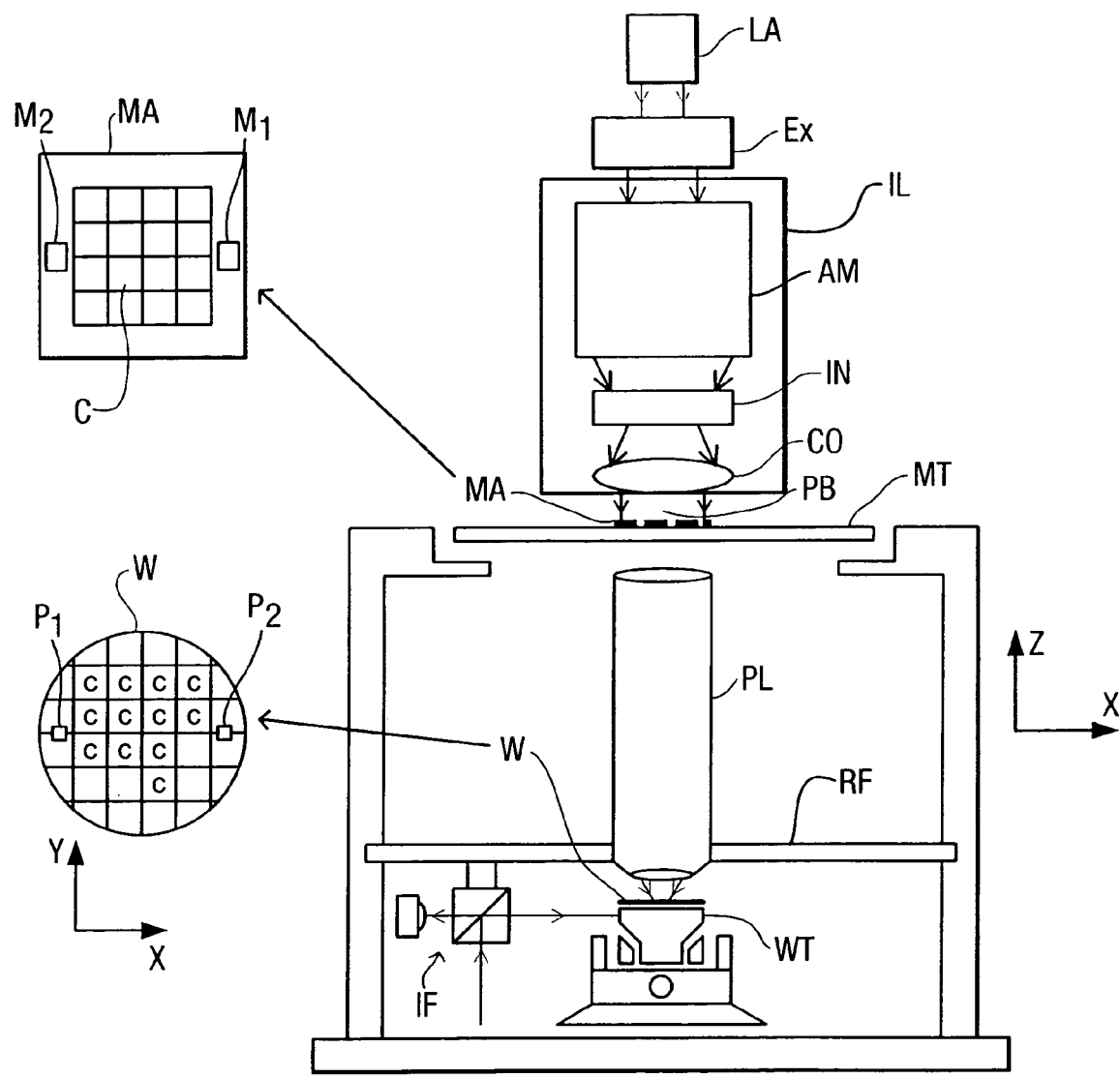
FIG. 15 schematically depicts a lithographic projection apparatus suitable for use with a mask designed with the aid of the current invention.

FIG. 15 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 20 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 20. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefor to be considered in all

We claim:

1. A method of generating a mask by identifying undesirable pitches between features when designing an integrated device to be formed on a substrate by use of a lithographic apparatus utilizing said mask, said method comprising the steps of:
   (a) identifying extreme interaction pitch regions by determining illumination intensity levels for a given illumination angle over a range of pitches;
   (b) identifying said undesirable pitches for each extreme interaction pitch region identified in step (a) by determining illumination intensities for a given extreme interaction pitch region over a range of illumination angles;
   (c) generating a mask pattern by arranging features such that no combination of features in said mask pattern has a pitch in an extreme interaction pitch region for which illumination angles in said desired illumination scheme are undesirable; and
   (d) positioning scattering bars in said mask pattern based on said extreme interaction pitch regions.

2. A method according to claim 1, wherein said extreme interaction pitch regions define regions which exhibit either substantial constructive optical interference or substantial destructive optical interference.

3. A method according to claim 1, wherein said undesirable pitches have corresponding illumination intensities exceeding a predetermined value.

4. A method according to claim 1, wherein said scattering bars are non-resolvable features operative for providing optical proximity correction.

5. A computer program product for controlling a computer comprising a recording medium readable by the computer, means recorded on the recording medium for directing the computer to generate files corresponding to a mask for use in an lithographic imaging process, said generation of said files comprising the steps of:
   (a) identifying extreme interaction pitch regions by determining illumination intensity levels for a given illumination angle over a range of pitches;
   (b) identifying said undesirable pitches for each extreme interaction pitch region identified in step (a) by determining illumination intensities for a given extreme interaction pitch region over a range of illumination angles; and
   (c) positioning scattering bars in said mask based on said extreme interaction pitch regions.

6. The computer product of claim 5, wherein said extreme interaction pitch regions define regions which exhibit either substantial constructive optical interference or substantial destructive optical interference.

7. The computer product of claim 5, wherein said undesirable pitches have corresponding illumination intensities exceeding a predetermined value.

8. The computer product of claim 5, further comprising the step of designing a mask pattern by arranging features such that no combination of features in said mask pattern has a pitch in an extreme interaction pitch region for which illumination angles in said desired illumination scheme are undesirable.

9. The computer product of claim 5, wherein said scattering bars are non-resolvable features operative for providing optical proximity correction.

* * * * *